(12) United States Patent
Burke

(10) Patent No.: US 8,294,208 B2
(45) Date of Patent: Oct. 23, 2012

(54) SEMICONDUCTOR DEVICE HAVING A GATE CONTACT ON ONE SURFACE ELECTRICALLY CONNECTED TO A GATE BUS ON AN OPPOSING SURFACE

(75) Inventor: Hugo R. G. Burke, Wales (GB)

(73) Assignee: International Rectifier Corporation, El Segundo, CA (US)

( * ) Notice: Subject to any disclaimer, the term of this patent is extended or adjusted under 35 U.S.C. 154(b) by 193 days.

(21) Appl. No.: 12/397,829

(22) Filed: Mar. 4, 2009

(65) Prior Publication Data

US 2009/0224313 A1    Sep. 10, 2009

Related U.S. Application Data

(60) Provisional application No. 61/033,445, filed on Mar. 4, 2008.

(51) Int. Cl.
*H01L 29/66* (2006.01)
(52) U.S. Cl. .............. 257/330; 257/341; 257/E21.262
(58) Field of Classification Search .............. 257/330, 257/331, 341, E29.262
See application file for complete search history.

(56) References Cited

U.S. PATENT DOCUMENTS

| | | | | |
|---|---|---|---|---|
| 6,677,669 | B2 * | 1/2004 | Standing | 257/685 |
| 2007/0215938 | A1 * | 9/2007 | Yanagida et al. | 257/330 |
| 2009/0085105 | A1 * | 4/2009 | Su et al. | 257/330 |

* cited by examiner

*Primary Examiner* — Chuong A Luu
*Assistant Examiner* — Nga Doan
(74) *Attorney, Agent, or Firm* — Farjami & Farjami LLP

(57) ABSTRACT

A power semiconductor device which includes a gate contact on one surface thereof connected to a gate bus on another opposing surface thereof using a conductive body extending through a via between the two surfaces of the device.

17 Claims, 3 Drawing Sheets

SEMICONDUCTOR DEVICE HAVING A GATE CONTACT ON ONE SURFACE ELECTRICALLY CONNECTED TO A GATE BUS ON AN OPPOSING SURFACE

CROSS REFERENCE TO RELATED APPLICATION

This application is based on and claims benefit of U.S. Provisional Application Ser. No. 61/033,445, filed on Mar. 4, 2008, entitled TOP DRAIN FET, to which a claim of priority is hereby made and the disclosure of which is incorporated by reference.

FIELD OF THE INVENTION

This invention relates to MOSgated devices, such as MOSFETs, IGBTs and the like, and more specifically relates to a device in which the drain and gate contacts are on one side of a semiconductor die and the source contact is on the opposite side of the die.

BACKGROUND OF THE INVENTION

MOSgated devices are well known and commonly have the source and gate contacts on one side of a semiconductor die or chip, and the drain contact on the opposite side of the die. It is frequently desirable to have the drain and gate contacts on one side of the die and the source contact on the opposite side. Such devices are commonly termed "top drain" devices. U.S. Pat. No. 7,323,745, issued Jan. 29, 2008 entitled TOP DRAIN MOSFET in the name of Daniel M. Kinzer and assigned to the assignee of this application shows a top drain device and a process for its manufacture.

The process needed to manufacture the device of the above U.S. Pat. No. 7,323,745 is complex, leading to increased device cost and reduced die yield. It would be desirable to provide a top drain structure which can be more easily manufactured with a reduced number of mask steps and employing the same basic manufacturing process used for the conventional top source device having source and gate contacts on the same die surface.

BRIEF SUMMARY OF THE INVENTION

In accordance with the invention, a conventional power semiconductor device is provided with a via under the gate bus thereof, which is then filled with a conductive body that electrically connects the gate bus to a gate contact on a side opposite to the gate bus.

DETAILED DESCRIPTION OF THE DRAWINGS

Figure 1:
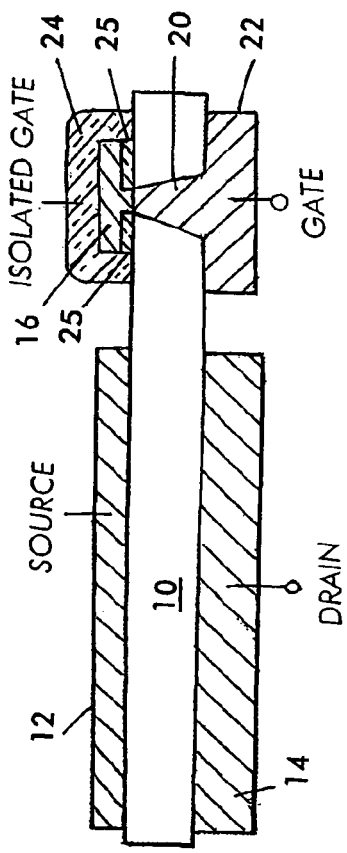
FIG. 1 is a schematic cross-sectional view of a power semiconductor device constructed in accordance with the invention.

FIG. 1 shows, schematically, a semiconductor device according to the present invention which includes a semiconductor die 10, e.g. a silicon die, having on a top side thereof well known MOSgated active structures each including source regions and insulated MOSgates. The source regions of the MOSgated structures are connected to a source contact 12 and the drain region of the device is connected to drain contact 14 which is connected to the bottom side (opposite the top side) of die 10. A conventional common gate bus 16 is connected to the gate electrodes of all the MOSgates on the top side of die 10 and is disposed on the top side but laterally spaced from source contact 12.

According to one aspect of the invention, a conductive via 20 extends through die 10 to its bottom, and receives a gate contact 22 on the bottom side of die 10 coplanar with drain contact 14. The upper side of gate contact bus 16 can be insulated by a silicon dioxide layer 24 and the bottom side of gate bus 16 can be insulated electrically from top surface of die 10 by insulation body (e.g. silicon dioxide body) 25.

Figure 2:
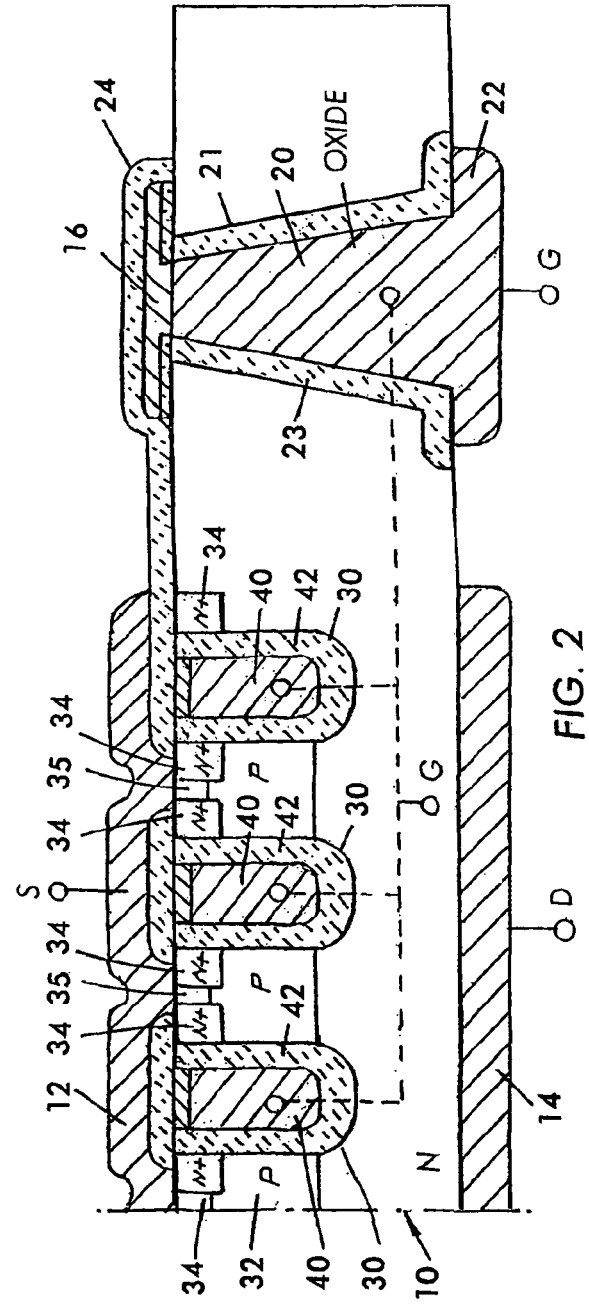
FIG. 2 shows a cross-sectional view of a small portion of a semiconductor device according to the first embodiment of the present invention.

FIG. 2 shows details for a trench-type device according to one preferred embodiment of the present invention having spaced gate trenches 30 formed in an N⁻ substrate.

A P type channel region 32 and N+ source region 34 are conventionally diffused into the N− substrate. Gate trenches 30 extend through channel region 32, lined with silicon dioxide gate insulation layers 42 and filled with respective conductive polysilicon gate electrodes 40. These gate electrodes 40 are suitably connected together and are connected to gate bus 16 which is then connected to gate contact 22 through a conductive body 20 (which may be a metallic body, conductive polysilicon or the like) disposed in a via 21 that extends all the way through (i.e. from the top side to the bottom side) the body of die 10. Note that conductive body 20 is insulated from semiconductor body of die 10 by an insulation body 23 (e.g. a silicon dioxide liner) which lines the sidewalls of via 21 in order to ensure that conductive body 20 does not make galvanic contact with die 10. Note that P channel region 32 includes central extensions 35 which penetrate the N⁺ source layer and are connected to source contact 12 to provide the desired source to channel connection to disable the parasitic NPN bipolar transistor elements. Further note that central extensions 35 of channel region 32 may be doped more, e.g., P⁺ doped and thus rendered less resistive compared to the rest of channel region 32 in order to decrease the resistance of the contact of channel region 32 with source contact 12.

The resulting device provides the desired "top drain" geometry with the drain and gate on one surface of die 10 (e.g. bottom surface) and the source contact on the opposite side (e.g. top surface). A skilled person would appreciate that to fabricate a device according to the present invention any well known process could be carried out to fabricated a device having MOSgated regions, a source contact and a gate bus on one surface and a drain contact on another surface, and then via 21, conductive body 20 therein in via 21, and gate contact 22 could be added to obtain a device according to the present invention.

Figure 3:
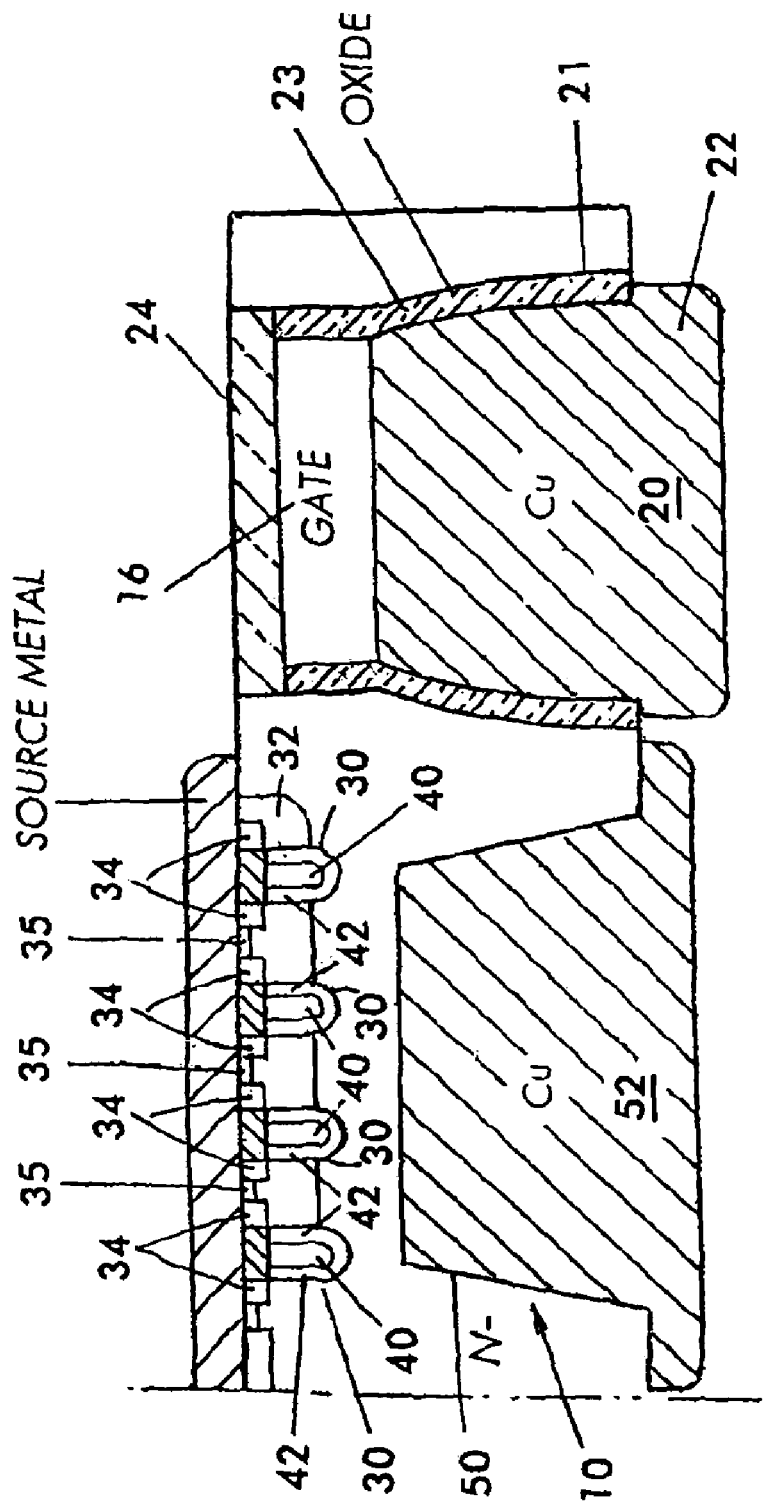
FIG. 3 shows a schematic cross-sectional view of a second embodiment of the invention.

FIG. 3 schematically shows a further embodiment of the invention in which components similar to those of FIGS. 1 and 2 have the same identifying numerals. FIG. 3 shows a deep trench 50 in die 10 under active gate trenches 30 and filled by a conductive drain contact 52 which is preferably comprised of copper. This structure reduces amount of silicon in the path between the drain and the source and thus reduces the die $R_{DSON}$. Drain contact 52 can be deposited in the same step which forms conductive body 20. Thus, in the example shown by FIG. 3 conductive body 20 is also comprised of copper. Note further that in the example shown by FIG. 3 gate bus 16 is recessed below the top surface of die 10 and thus is located inside a recess or a trench in the body of die 10 at one end of via 21. Note that the side walls of gate bus 16 are insulated electrically from die body 10 by insulation layer 23, and insulation layer 24 is preferably coplanar with the top surface of die 10 while recessed inside die 10.

A semiconductor device according to the present invention may exhibit lower gate resistance (Rg) and a lower gate inductance (Lg) compared to a conventional device of identical characteristics and capabilities.

Furthermore, a device according to the present invention allows for novel packaging layouts, particularly, for novel copacking layouts in which two or more die are packaged together to form part of a circuit.

For example, in one preferred arrangement, a semiconductor device (e.g. a power MOSFET) according to the present invention may be copackaged with a conventional semiconductor device (e.g. a power MOSFET) to realize a half-bridge which can be used in a variety of applications including motor control applications or power converter applications.

A typical half-bridge includes a first power device such as a power MOSFET having a first power electrode (e.g. source electrode) thereof electrically connected to another power electrode of (e.g. drain electrode) of a second power semiconductor device (e.g. a second power MOSFET).

Using a power MOSFET (or IGBT or the like power semiconductor device) according to the present invention and a conventional power MOSFET (or conventional IGBT or the like power semiconductor device) a copackage may be realized having a simpler configuration.

Figure 4A:
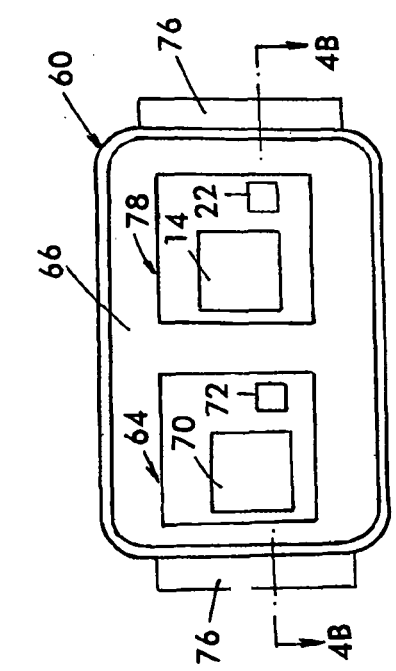
FIG. 4A shows a plan view of a copackage that includes a device according to the present invention.
Figure 4B:
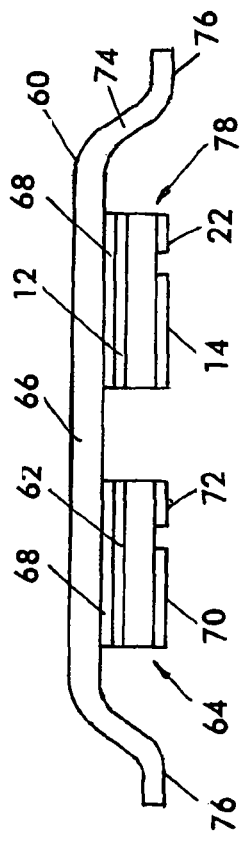
FIG. 4B shows a cross-sectional view along line 4B-4B viewed in the direction of the arrows shown in FIG. 4A.

For example, referring to FIGS. 4A and 4B, a conductive metallic clip 60 may be used to electrically connect source electrode 12 of a semiconductor MOSFET 78 according to the present invention to drain electrode 62 of a conventional MOSFET 64. Specifically, source electrode 12 is electrically and mechanically coupled to a first surface of web portion 66 of clip 60 using a conductive adhesive such as solder or conductive epoxy 68, while drain electrode 62 is electrically and mechanically coupled to the same first surface using a conductive adhesive 68 such as solder or a conductive epoxy.

Clip 60 may be a conductive can comprised of copper or a copper alloy such as the one disclosed in U.S. Pat. Nos. 6,767,820 or 6,677,669 (the disclosure of which is incorporated by reference). Such a can may be a unitary body that includes a web portion 66, a wall 74 surrounding web portion 66 which extends to and terminates at connection surfaces 76 configured for external connection for the output node of the half-bridge. Note that connection surfaces 76 may be generally on a plane parallel (for example, coplanar with) to the plane of the free surfaces of gate contact 22 and drain contact 14 of MOSFET 78 and gate contact 72 and source contact 70 of conventional MOSFET 64, which have been configured for flip-chip mounting (for example, have been rendered solderable) using a conductive adhesive such as solder or a conductive epoxy.

Figure 5A:
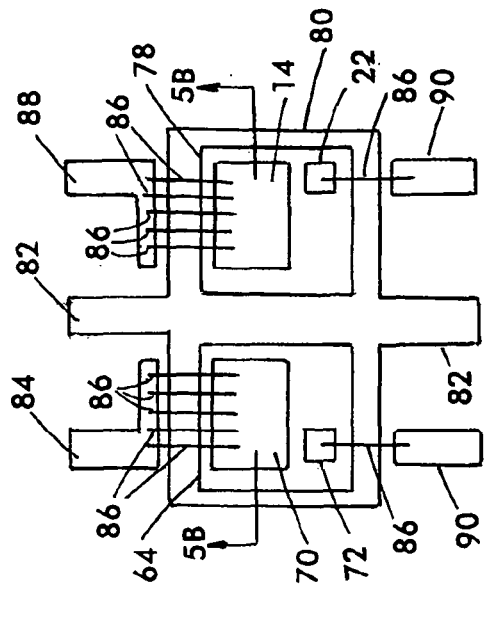
FIG. 5A shows a top plan view of another embodiment of a package that includes a semiconductor device according to the present invention.
Figure 5B:
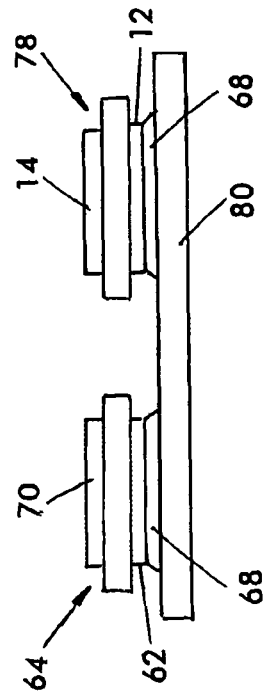
FIG. 5B shows a cross-sectional view along line 5B-5B viewed in the direction of the arrows shown in FIG. 5A.

Referring to FIGS. 5A-5B, in an alternative arrangement, power MOSFET 64, 78 may be copackaged in a six-pin in-line package to realize a half-bridge. Specifically, source electrode 12 of MOSFET 78 and drain electrode 62 of MOS-FET 64 are coupled to a first surface of die pad 80 using a conductive adhesive 68 (e.g. solder or a conductive epoxy). Note that conductive pad 18 may include unitarily integrated leads 82 each extending away from a respective parallel side thereof and serving as an external connection for the output node of the half-bridge.

Furthermore, the package may include a source lead 84 electrically connected to source electrode 70 using wire bonds 86 (or alternatively a conductive strap such as a copper strap), a drain lead 88 electrically connected to drain electrode 14 using wire bonds 86 (or alternatively, a conductive strap such as a copper strap), and gate leads 90 each electrically connected to a respective gate electrode 22, 72 using a wire bond 86 or the like. Note that although not shown, at least the first surface of pad 80, devices 64, 78, and at least portions of leads 82, 84, 88, 90 may be covered by mold compound which will serve as the housing of the package.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power semiconductor device comprising:
   a semiconductor body having active regions on a first surface thereof, said active regions including gate electrodes;
   a first power electrode over said first surface of said semiconductor body;
   a second power electrode over a second surface of said semiconductor body opposite said first surface;
   a via extending through said semiconductor body;
   a gate bus electrically connected to said gate electrodes;
   a gate contact over said second surface and exposed for external connection; and
   a conductive body inside said via and having two opposing ends, one of said ends being electrically connected to said gate contact and another end electrically connected to said gate bus.

2. The power semiconductor device of claim 1, wherein said via includes an insulation body lining the sidewalls thereof and disposed between said conductive body and said semiconductor body.

3. The power semiconductor device of claim 1, further comprising an insulation body over said gate bus.

4. The power semiconductor device of claim 1, wherein said gate bus is disposed inside a recess formed inside said semiconductor body at one end of said via.

5. The power semiconductor device of claim 1, wherein said second power electrode extends into a recess which extends from said second surface into said semiconductor body.

6. The power semiconductor device of claim 1, wherein said semiconductor device is a MOSFET, in which said first power electrode is a source electrode and said second power electrode is a drain electrode.

7. The power semiconductor device of claim 6, wherein said MOSFET is a trench type MOSFET.

8. A semiconductor package, comprising:
   a semiconductor device that includes a semiconductor body having active regions on a first surface thereof, said active regions including gate electrodes;
   a first power electrode over said first surface of said semiconductor body;
   a second power electrode over a second surface of said semiconductor body opposite said first surface;

a via extending through said semiconductor body;
a gate bus electrically connected to said gate electrodes;
a gate contact over said second surface and exposed for external connection; and
a conductive body inside said via and having two opposing ends, one of said ends being electrically connected to said gate contact and another end electrically connected to said gate bus.

9. The package of claim 8, wherein said via includes an insulation body lining the sidewalls thereof and disposed between said conductive body and said semiconductor body.

10. The package of claim 8, further comprising an insulation body over said gate bus.

11. The package of claim 8, wherein said gate bus is disposed inside a recess formed inside said semiconductor body at one end of said via.

12. The package of claim 8, wherein said second power electrode extends into a recess which extends from said second surface into said semiconductor body.

13. The package of claim 8, wherein said semiconductor device is a MOSFET, in which said first power electrode is a source electrode and said second power electrode is a drain electrode.

14. The package of claim 13, wherein said MOSFET is a trench type MOSFET.

15. The package of claim 8, further comprising another power semiconductor device having a first power electrode and gate contact on one surface thereof and a second power electrode on another opposing surface thereof, wherein said first power electrode of said semiconductor device and said second power electrode of said another power semiconductor device are electrically connected to one another through a conductive metallic body.

16. The package of claim 15, wherein said conductive metallic body comprises a web portion of a conductive clip, said conductive clip having a connection surface on a plane parallel to free surfaces of said gate contacts, said first power electrode of said another power semiconductor device and said second power electrode of said semiconductor device.

17. The package of claim 15, wherein said semiconductor device and said another power semiconductor device are connected to realize a half-bridge.

\* \* \* \* \*